(12) United States Patent
Chen et al.

(10) Patent No.: US 9,059,686 B2
(45) Date of Patent: Jun. 16, 2015

(54) PSEUDO-CML LATCH AND DIVIDER HAVING REDUCED CHARGE SHARING BETWEEN OUTPUT NODES

(71) Applicant: QUALCOMM Incorporated, San Diego, CA (US)

(72) Inventors: Wu-Hsin Chen, San Diego, CA (US); Li Liu, San Diego, CA (US); Jianyun Hu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/926,680

(22) Filed: Jun. 25, 2013

(65) Prior Publication Data
US 2014/0375367 A1   Dec. 25, 2014

(51) Int. Cl.
| H03K 3/00 | (2006.01) |
| H03K 3/027 | (2006.01) |
| H03K 3/037 | (2006.01) |
| H03K 3/017 | (2006.01) |
| H01L 21/8238 | (2006.01) |
| H03K 3/356 | (2006.01) |

(52) U.S. Cl.
CPC ........ H03K 3/017 (2013.01); H01L 21/823871 (2013.01); H03K 3/356121 (2013.01); H03K 3/356139 (2013.01)

(58) Field of Classification Search
CPC .......... H03K 3/00; H03K 3/027; H03K 3/037
USPC ........................... 327/210–212, 214, 215, 218
See application file for complete search history.

(56) References Cited

U.S. PATENT DOCUMENTS

| 4,845,675 | A | * | 7/1989 | Krenik et al. ................. 365/203 |
| 6,166,571 | A | | 12/2000 | Wang |
| 7,057,421 | B2 | | 6/2006 | Shi et al. |
| 7,388,416 | B2 | | 6/2008 | Marutani |
| 8,736,334 | B2 | * | 5/2014 | Kao et al. ....................... 327/208 |
| 2003/0042965 | A1 | | 3/2003 | Kanno et al. |
| 2009/0284288 | A1 | | 11/2009 | Zhang et al. |
| 2009/0302893 | A1 | | 12/2009 | Singh |
| 2010/0073040 | A1 | | 3/2010 | Jo et al. |
| 2012/0154009 | A1 | | 6/2012 | Ho |
| 2013/0021078 | A1 | | 1/2013 | Elkin et al. |

FOREIGN PATENT DOCUMENTS

EP    0 768 758 A1    4/1997

OTHER PUBLICATIONS

International Search Report and Written Opinion—PCT/US2014/042935—ISA/EPO—Sep. 3, 2014. (18 total pages).

* cited by examiner

*Primary Examiner* — Hai L Nguyen
(74) *Attorney, Agent, or Firm* — Arent Fox LLP (57) ABSTRACT

In one example, a high-speed divider includes two identical pseudo-CML latches and four output inverters. Each latch includes a pair of cross-coupled signal holding transistors. A first P-channel pull-up circuit pulls up on a second output node QB of the latch. A second P-channel pull-up circuit pulls up on a first output node Q of the latch. A pull-down circuit involves four N-channel transistors. This pull-down circuit: 1) couples the QB node to ground when a clock signal CK is high and a data signal D is high, 2) couples the Q node to ground when CK is high and D is low, 3) prevents a transfer of charge between the QB and Q nodes through the pull-down circuit when D transitions during a time period when CK is low, and 4) decouples the QB and Q nodes from the pull-down circuit when CK is low.

13 Claims, 11 Drawing Sheets

DIVIDER USING PSEUDO-CML LATCHES

FIG. 5

PSEUDO-CML LATCH

WAVEFORMS FOR LATCH OF FIG. 6

FIG. 8

(PRIOR ART)

FIG. 9

CLK IS INITIALLY LOW, D IS HIGH

FIG. 10

D TRANSITIONS LOW AND DB TRANSITIONS HIGH, CLK IS STILL LOW

FIG. 11

AFTER D AND DB ARE STABLE THEN CLK TRANSITIONS HIGH

FIG. 12

WAVEFORMS FOR PRIOR ART OF FIG. 9

(PRIOR ART)

FIG. 13

| | TEMP (°C) | PHASE NOISE (dBc) | CURRENT (mA) |
|---|---|---|---|
| PRIOR ART LATCH OF FIG. 9 | | | |
| ffMOS_ffRC | -30° | -160.5 | 17.65 |
| ssMOS_ssRC | -30° | -158.3 | 12.13 |
| ttMOS_ttRC | 55° | -157.9 | 13.87 |
| ffMOS_ffRC | 110° | -157.4 | 17.58 |
| ssMOS_ssRC | 110° | -155.8 | 11.54 |
| LATCH OF FIG. 6 | | | |
| ffMOS_ffRC | -30° | -161.5 | 19.49 |
| ssMOS_ssRC | -30° | -158.5 | 13.61 |
| ttMOS_ttRC | 55° | -159.2 | 15.41 |
| ffMOS_ffRC | 110° | -158.4 | 19.18 |
| ssMOS_ssRC | 110° | -156.0 | 12.76 |

COMPARISON OF A DIVIDIER USING THE LATCH OF FIG. 6 WITH A DIVIDER USING THE PRIOR ART LATCH OF FIG. 9

PSEUDO-CML LATCH
(COMPLEMENTARY-FORM VERSION)

PSEUDO-CML LATCH AND DIVIDER HAVING REDUCED CHARGE SHARING BETWEEN OUTPUT NODES

BACKGROUND INFORMATION

1. Technical Field

The present disclosure relates to high-speed latches and high-speed dividers.

2. Background Information

High-speed dividers are often realized using two latches that are interconnected in a cascaded configuration, with the two latches being clocked on opposite phases of the incoming clock signal, and with the signals output from the second latch being inverted and fed back to the inputs of the first latch. The two latches can be implemented in different ways. Current Mode Logic (CML) latches are fast, but such a latch generally has four branches, any one of which can conduct current from a supply voltage conductor to ground potential on a ground conductor. Due to the CML topology, there is always current flow from the supply voltage conductor through pullup resistors to the ground conductor through one of the four branches. As a result, current consumption of a high frequency divider implemented using CML latches is undesirably high. Also, the voltage swing of the output signals are generally not rail-to-rail. A so-called pseudo-CML latch can therefore be used. One such pseudo-CML latch is set forth in U.S. Patent Publication No. US2009/0284288A1. The pseudo-CML latch results in the divider having reduced current consumption.

SUMMARY

A high-speed pseudo-CML divider is disclosed that has improved output signal shape and improved performance. In one example, the high-speed pseudo-CML divider includes two pseudo-CML latches and four inverters. The two latches are interconnected in a cascaded configuration, with the two latches being clocked on opposite phases of the incoming clock signal CK, and with the two output signals output from the second latch being flipped and fed back to the inputs of the first latch. A pair of output signals output by the first latch is buffered by two of the inverters and is output from the divider as divider output signals I and IB. The pair of output signals output by the second latch is buffered by the other two inverters and is output from the divider as divider output signals Q and QB. Each of the four output signals I, IB, Q and QB is of half the frequency of the clock signal CK that clocks the divider.

The first and second pseudo-CML latches are of identical construction. The first pseudo-CML latch includes a pair of cross-coupled relatively weak and small signal holding N-channel transistors. A first output node Q (N1) of the latch is coupled to a P-channel transistor that acts as a first clocked pull-up circuit on the first output node Q. In other embodiments, another type of pull-up circuit may be employed. A second output node QB (N2) of the latch is coupled to a P-channel transistor that acts as a second clocked pull-up circuit on the second output node QB. In other embodiments, another type of pull-up circuit may be employed. The latch also includes a pull-down circuit that: 1) couples the second output node QB (N2) to a ground node when clock signal CK is high and data signal D is high, 2) couples the first output node Q (N1) to the ground node when clock signal CK is high and data signal D is low, 3) prevents a transfer of charge between the first and second output nodes through the pull-down circuit when data signal D transitions during a time period when the clock signal CK is low, and 4) decouples the first and second output nodes from the pull-down circuit when the clock signal CK is low. In one embodiment, the pull-down circuit is four transistors, two of which are coupled in series between the second output node and a ground conductor, and the other two of which are coupled in series between the first output node and the ground conductor.

Due to the action of the pull-down circuit in preventing transfer of charge between the latch output nodes during the time period with the clock signal CK is low, the signal waveforms of the latch output signals do not suffer a signal drooping problem when the latch is used in a divider application. Elimination of the signal drooping problem results in improved divider performance. The output signals of the divider have improved phase noise as compared to output signals of a divider whose latches are conventional pseudo-CML latches. Also, the positive duty cycle of the divider output signals is more stable, and is less sensitive to changes in frequency and to changes in process, than is the positive duty cycle of the signals output by a divider whose latches are conventional pseudo-CML latches.

The pseudo-CML latch is of general applicability in logic circuitry, and is not limited to use in high-speed dividers. The pseudo-CML latch can be realized in complementary form by flipping the circuit topology, and changing all N-channel transistors to P-channel transistors, and changing all P-channel transistors to N-channel transistors. The complementary form of the latch has N-channel pull-down circuits that pull down on the latch output nodes, whereas the non-complementary form of the latch described above has P-channel pull-up circuits that pull up on the latch output nodes.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
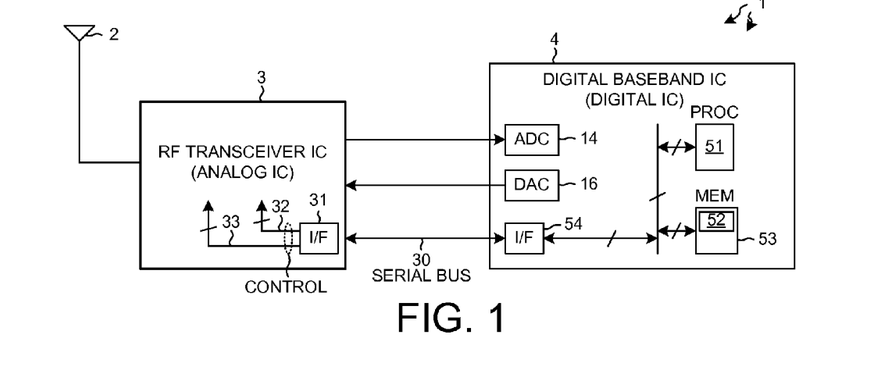
FIG. 1 is a very simplified high level block diagram of a mobile communication device 1 in accordance with one novel aspect.

FIG. 1 is a very simplified high level block diagram of a mobile communication device 1 in accordance with one novel aspect. In this example, mobile communication device 1 is a cellular telephone. The cellular telephone includes (among several other components not illustrated) an antenna 2 and two integrated circuits 3 and 4. Integrated circuit 4 is called a "digital baseband integrated circuit." Integrated circuit 3 is a Radio Frequency (RF) transceiver integrated circuit. RF transceiver integrated circuit 3 is called a "transceiver" because it includes a transmitter as well as a receiver.

Figure 2:
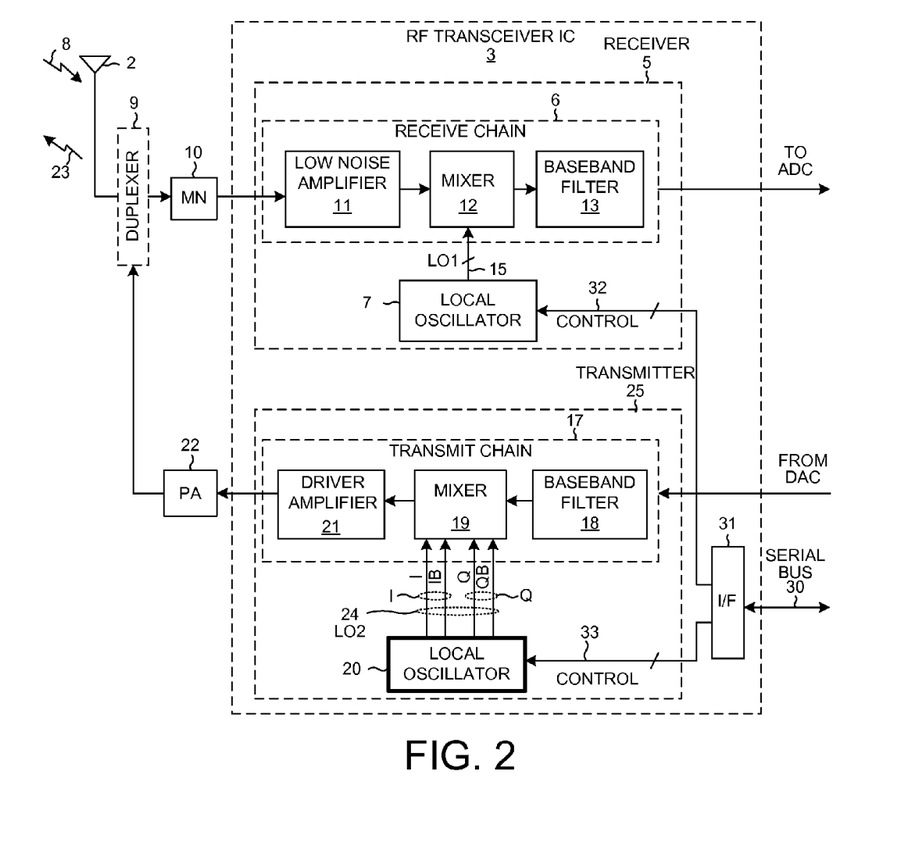
FIG. 2 is a more detailed block diagram of the RF transceiver integrated circuit 3 of FIG. 1.

FIG. 2 is a more detailed block diagram of the RF transceiver integrated circuit 3 of FIG. 1. A receiver 5 includes what is called a "receive chain" 6 as well as a Local Oscillator (LO) 7. When the cellular telephone 1 is receiving, a high frequency RF signal 8 is received on antenna 2. Information from signal 8 passes through duplexer 9, matching network 10, and through the receive chain 6. Signal 8 is amplified by Low Noise Amplifier (LNA) 11 and is down-converted in frequency by mixer 12. The resulting down-converted signal is filtered by baseband filter 13 and is passed to the digital baseband integrated circuit 4. An analog-to-digital converter 14 in the digital baseband integrated circuit 4 converts the signal into digital form and the resulting digital information is processed by digital circuitry in the digital baseband integrated circuit 4. The digital baseband integrated circuit 4 tunes the receiver by controlling the frequency of the Local Oscillator (LO1) signal supplied on local oscillator outputs 15 to mixer 12.

If the cellular telephone 1 is transmitting, then information to be transmitted is converted into analog form by a Digital-to-Analog Converter (DAC) 16 in the digital baseband integrated circuit 4 and is supplied to a "transmit chain" 17 in the RF transceiver integrated circuit 3. Baseband filter 18 then filters out noise due to the digital-to-analog conversion process. Mixer block 19 under control of local oscillator 20 then up-converts the signal into a high frequency signal. Driver amplifier 21 and an external power amplifier 22 amplify the high frequency signal to drive antenna 2 so that a high frequency RF signal 23 is transmitted from antenna 2. The digital baseband integrated circuit 4 controls the transmitter 25 by controlling the frequency of a Local Oscillator (LO2) signal 24 to mixer 19. Transmitter 25 includes the transmit chain 17 and the local oscillator 20. Local oscillator signal LO2 24 includes a differential In-phase (I) signal and a differential Quadrature (Q) signal that are supplied via conductors 26-29 to mixer 19. Digital baseband integrated circuit 4 controls the local oscillators 7 and 20 by sending appropriate control information across digital bus 30, through bus interface 31, and control lines 32 and 33.

Figure 3:
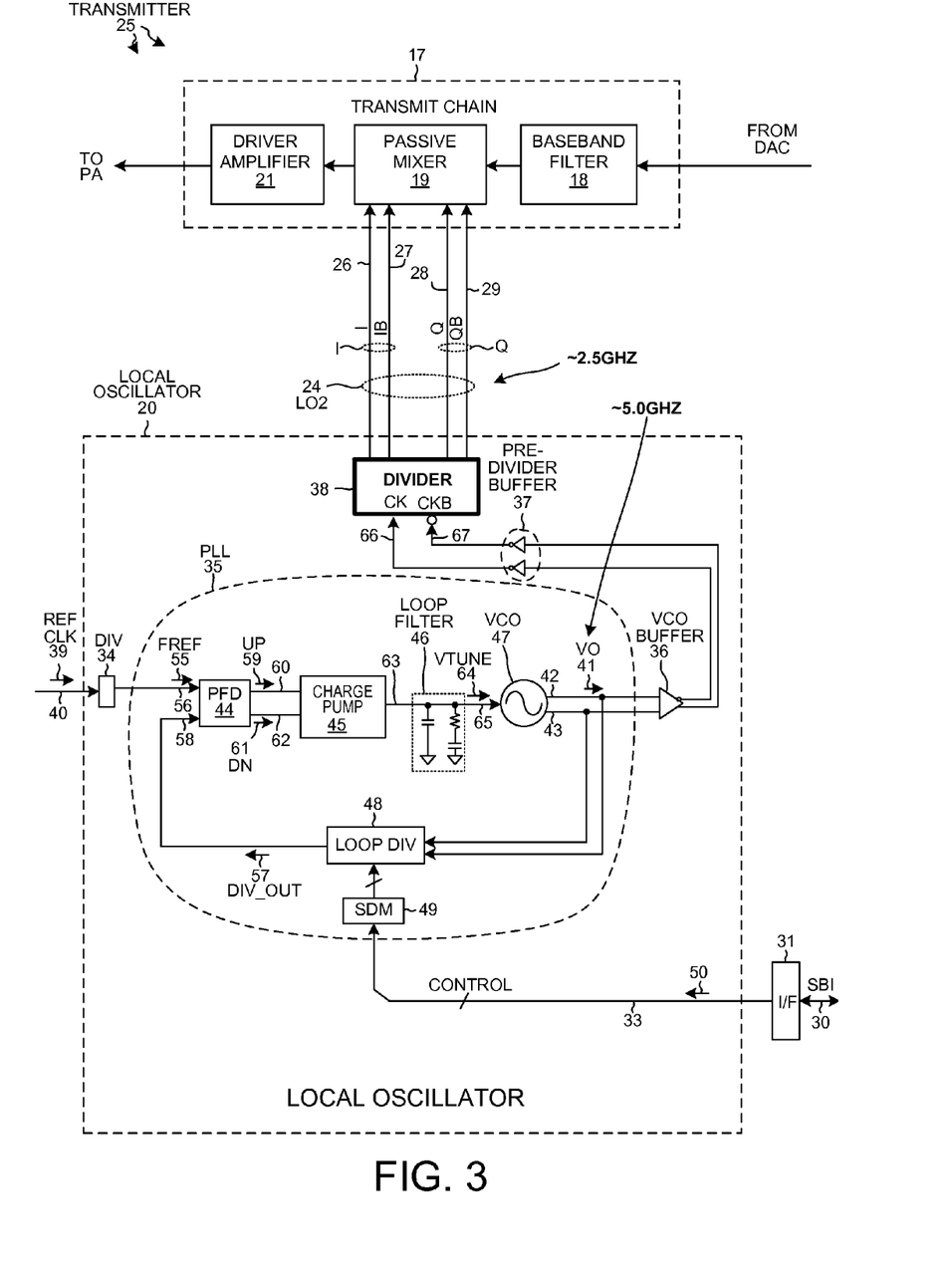
FIG. 3 is a more detailed diagram of local oscillator 20 in the RF transceiver integrated circuit 3 of FIG. 2.

FIG. 3 is a more detailed diagram of local oscillator 20 of the transmitter 25 in the RF transceiver integrated circuit 3 of FIG. 2. Local oscillator 20 includes divider 34, a Phase-Locked Loop (PLL) 35, a Voltage Controlled Oscillator (VCO) buffer 36, a pre-divider buffer 37, and a novel divider 38. PLL 35 receives an externally generated reference signal REF CLK 39 on conductor 40 (for example, a 19.2 MHz signal generated by an external crystal oscillator) and generates therefrom a differential PLL output signal VO 41 on conductors 42 and 43. The label "VO" used here indicates that the VO signal is the VCO output signal. The PLL 35 in this example includes a Phase-Frequency Detector (PFD) 44, a charge pump 45, a loop filter 46, a Voltage Controlled Oscillator (VCO) 47, a loop divider 48, and a Sigma-Delta Modulator (SDM) 49. The VO signal 41 output by the VCO 47 is divided down in frequency by divider 38 to generate local oscillator signal LO2 24. The local oscillator signal LO2 24 includes the signals I, IB, Q and QB. These signals are supplied to mixer 19 of the transmit chain 17 via conductors 26-29, respectively. A multi-bit digital control signal 50 is determined by the processor 51 (see FIG. 1) in digital baseband integrated circuit 4 by the execution of a set of processor-executable instructions 52 stored in a processor-readable medium 53. After the multi-bit digital control signal 50 is determined, it is communicated through serial bus interface 54, across serial bus 30, through serial bus interface 31, and via conductors 33 to local oscillator 20.

PLL 35 of FIG. 3 operates as follows. The externally generated REF CLK 39 on conductor 40 is divided down in frequency by divider 34 so that a lower frequency clock reference signal FREF 55 is supplied onto an input lead 56 of PFD 44. PFD 44 also receives a divided-down single-bit feedback signal DIV_OUT 57 onto input lead 58. From these two signals, PFD 44 generates and supplies an up charge pump control signal UP 59 onto output lead 60 and a down charge pump control signal DN 61 onto output lead 62. Charge pump 45 receives the charge pump control signals UP 59 and DN 61 and generates a charge pump output current pulse train signal onto conductor 63. As a result of low-pass filtering, the resulting tuning signal VTUNE 64 is supplied onto the tuning control input lead 65 of VCO 47. Signal VTUNE 64 is a relatively slow moving DC control signal that controls the VCO 47 to output signal VO 41 onto conductors 42 and 43. Signal VO is divided down in frequency by loop divider 48 to generate signal DIV_OUT 57. The control loop operates by controlling the frequency of the signal VO such that the frequency and phase of signal DIV_OUT is locked to the frequency and phase of signal FREF. Loop divider 48 frequency divides signal VO by a multi-bit digital divisor value received from sigma-delta modulator 49. Sigma-delta modulator 49 changes the divisor value back and forth from an integer value to the next integer over time such that over time the frequency of signal VO is divided by a desired fractional divisor value. Digital baseband processor integrated circuit 4 controls and sets this fractional divisor value by setting multi-bit digital control signal 50.

Figure 4:
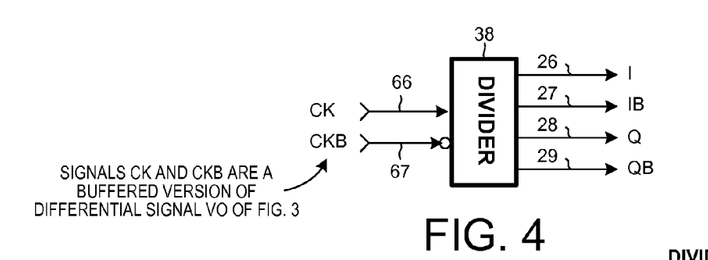
FIG. 4 is a diagram of the block symbol for divider 38 of FIG. 3.

FIG. 4 is a diagram of the block symbol for divider 38 of FIG. 3. Signals CK and CKB of FIG. 4 are a buffered version of differential signal VO of FIG. 3. Signal CK is received onto divider 38 via conductor and input lead 66. Signal CKB is received onto divider 38 via conductor and input lead 67. Output signals I, IB, Q and QB are output from divider 38 and are supplied to mixer 19 via conductors and output leads 26-29, respectively.

Figure 5:
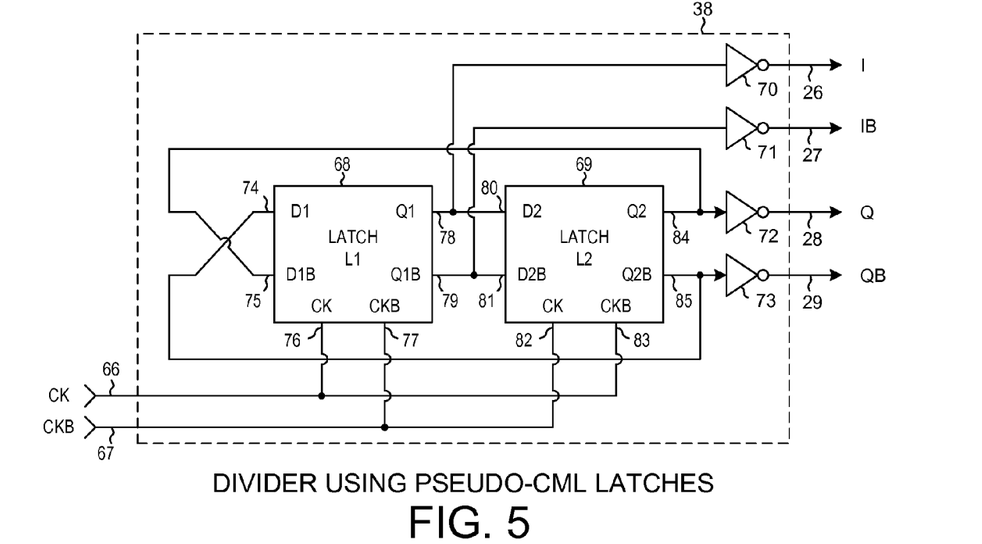
FIG. 5 is a more detailed diagram of divider 38 of FIG. 4.

FIG. 5 is a more detailed diagram of divider 38. Divider 38 includes a first transparent pseudo-CML latch L1 68, a second transparent pseudo-CML latch L2 69, and four inverters 70-73, interconnected as shown in FIG. 5. Pseudo-CML latch L1 68 has a data signal input lead and conductor D1 74, an inverted data signal input lead and conductor D1B 75, a clock signal input lead and conductor CK 76, an inverted clock signal input lead and conductor CKB 77, a data signal output lead and conductor Q1 78, and an inverted data signal output lead and conductor Q1B 79. Pseudo-CML latch L2 69 has a data signal input lead and conductor D2 80, an inverted data signal input lead and conductor D2B 81, a clock signal input lead and conductor CK 82, an inverted clock signal input lead and conductor CKB 83, a data signal output lead and conductor Q2 84, and an inverted data signal output lead and conductor Q2B 85. Pseudo-CML latches L1 and L2 are of identical construction.

The data signal inputs D2 and D2B of latch L2 are coupled to the data signal outputs Q1 and Q1B of latch L1, but the two latches are coupled to the clock signal conductors 66 and 67 so that the two latches are clocked on opposite phases of the clock signal CK. The two latches form a flip-flop. The data signal outputs Q2 and Q2B of latch L2 are fed back to the data signal inputs D1 and D1B of latch L1 in inverted fashion, however, so that the flip-flop toggles. The toggle flip-flop structure frequency divides the frequency of the input clock signal CK by two. Each of the output signals I, IB, Q and QB is of half the frequency of the input clock signal CK, but the signals I and Q are ninety degrees out of phase with respect to one another. Output signal IB is the inverse of output signal I. Output signal QB is the inverse of output signal Q.

Figure 6:
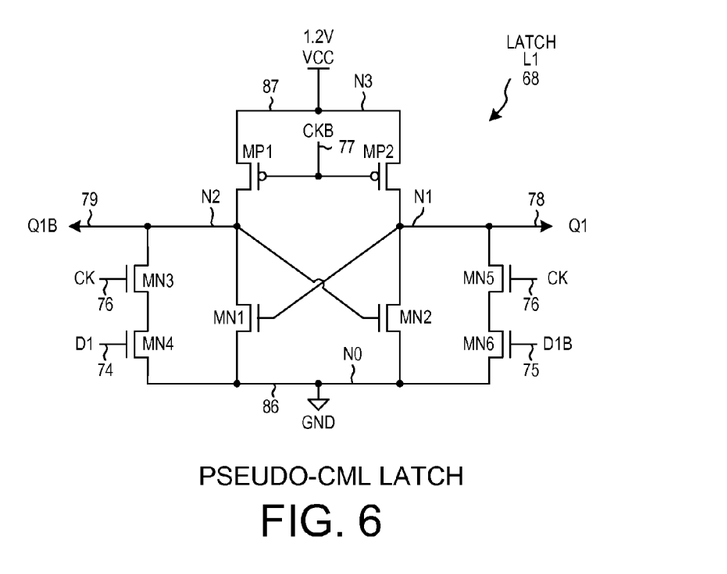
FIG. 6 is a more detailed circuit diagram of the pseudo-CML latch 68 of FIG. 5.

FIG. 6 is a more detailed circuit diagram of the pseudo-CML latch L1 68 of FIG. 5. Latch L1 68 includes a first N-channel field effect transistor MN1, a second N-channel field effect transistor MN2, a third N-channel field effect transistor MN3, a fourth N-channel field effect transistor MN4, a fifth N-channel field effect transistor MN5, a sixth N-channel field effect transistor MN6, a first P-channel field effect transistor MP1, and a second P-channel field effect transistor MP2, interconnected as shown in FIG. 6. Reference numeral N1 identifies the Q1 output node of the latch. Reference numeral N2 identifies the Q1B output node of the latch. Reference numeral N0 identifies a ground node of the latch. Ground conductor 86 is part of this ground node N0. Reference numeral N3 identifies a supply voltage node of the latch. Supply voltage conductors 87 is part of this supply voltage node N3. Supply voltage VCC is 1.2 volts and ground potential is 0 volts. The sizes of the transistors are: MN1=8 um/65 nm; MN2=8 um/65 nm; MN3=18 u/65 nm; MN4=12 u/65 nm; MN5=18 u/65 nm; MN6=12 um/65 nm; MP1=12 um/65 nm; MP2=12 um/65 nm. The P-channel transistors in the inverters 70-73 are 20 um/65 nm in size, and the N-channel transistors in the inverters 70-73 are 10 um/65 nm. The transistors of the latch 68 are formed, and the latch 68 of FIG. 6 is fabricated in integrated circuit form, using a standard 65 nm CMOS (Complementary Metal Oxide Semiconductor) process. The switching point (the triggering voltage) of the inverters 70-73 is half of the VCC supply voltage. The switching point is therefore 0.6 volts in this case. Unlike a true CML latch where there is always static current flow through the latch, in the pseudo-CML latch 68 of FIG. 6 there is no static current flow through the latch half the time (when incoming clock signal CK is low).

The first N-channel transistor MN1 has a source, a drain, and a gate. The second N-channel transistor MN2 has a source coupled to the source of the first N-channel transistor, a drain coupled to the gate of the first N-channel transistor, and a gate coupled to the drain of the first N-channel transistor. The third N-channel transistor MN3 has a source, a gate, and a drain coupled to the drain of the first N-channel transistor. The fourth N-channel transistor MN4 has a source coupled to the source of the first N-channel transistor, a gate, and a drain coupled to the source of the third N-channel transistor. The fifth N-channel transistor MN5 has a source, a gate, and a drain coupled to the drain of the second N-channel transistor. The sixth N-channel transistor MN6 has a source coupled to the source of the second N-channel transistor, a gate, and a drain coupled to the source of the fifth N-channel transistor. The first P-channel transistor MP1 has a source, a gate, and a drain coupled to the drain of the first N-channel transistor. The second P-channel transistor MP2 has a source coupled to the source of the first P-channel transistor, a gate coupled to the gate of the first P-channel transistor, and a drain coupled to the drain of the second N-channel transistor.

N-channel transistors MN1 and MN2 together are a cross-coupled pair of weak signal holding transistors.

P-channel transistor MP1 is a first pull-up circuit that is coupled to the N2 node.

P-channel transistors MP2 is a second pull-up circuit that is coupled to the N1 node.

N-channel transistors MN3, MN4, MN5 and MN6 together are a pull-down circuit that: 1) couples node N2 to a ground node N0 when clock signal CK is high and a data signal D1 is high, 2) couples node N1 to ground node N0 when clock signal CK is high and data signal D1 is low, 3) prevents a transfer of charge between nodes N2 and N1 through the pull-down circuit when the data signal D1 transitions during a time period when the clock signal CK is low, and 4) decouples the N1 and N2 nodes from the pull-down circuit when the clock signal CK is low (so that substantially no charge can move from the N1 and N2 nodes into the pull-down circuit when CK is low, and so that substantially no charge can move from the pull-down circuit onto the N1 and N2 nodes when CK is low). The transistors of the pull-down circuit that are clocked by clock signal CK (namely transistors MN3 and MN5) are located between the N1 and N2 nodes and the remainder of the pull-down circuit, so when the clock signal CK is low these transistors are off and regardless of how the data signal D1 might be transitioning there can be no transfer of charge between nodes N2 and N1 through the pull-down circuit.

In operation, if the clock signal CK is low, then P-channel transistors MP1 and MP2 are off. Nodes N2 and N1 are therefore not being coupled to supply voltage node N3 by the pull-up circuits. Also, N-channel transistor MN3 is off. Node N2 is therefore not being coupled to ground node N0 via transistors MN3 and MN4. Also, N-channel transistor MN5 is off, so node N1 is not being coupled to ground node N0 via transistors MN5 and MN6. The MN3 and MN5 transistors of the pull-down circuit are located close to the N2 and N1 nodes between these nodes and the remainder of the pull-down circuit, consequently when these transistors MN3 and MN5 are off the load of the pull-down circuit is disconnected from nodes N2 and N1. Accordingly, when the clock signal CK is low, nodes N2 and N1 are effectively cut off from the ground node N0, other than through one small holding transistor (one of MN1 and MN2) that is weakly coupling its corresponding node to ground. Depending on the state in which the smaller holding transistors MN1 and MN2 are latched, this small holding transistor is on and is weakly coupling its drain to the ground node N0. But other than the slight effect of this small holding transistor, the nodes N1 and N2 are floating in that they are not coupled to the supply voltage node N3 and they are not coupled to the ground node N0.

If the clock signal CK is high, however, then the P-channel pull-up circuits are on and nodes N2 and N1 are weakly coupled to the supply voltage node N3. N-channel transistors MN3 and MN4 are both on, so depending on which of MN4 and MN6 is on due to the value of the data signal D1, one of the nodes N2 and N1 is coupled to ground node N0 through the pull-down circuit of transistors MN3, MN4, MN5 and MN6. How the smaller holding transistors MN1 and MN2 were previously latched can be changed by the action of the larger transistors MN3, MN4, MN5 and MN6. Accordingly, when the clock signal CK is high then the digital value stored in the latch can be changed by data signal D1, whereas if the clock signal CK is low then the digital value stored in the latch is maintained by the cross-coupled holding transistors MN1 and MN2.

Figure 7:
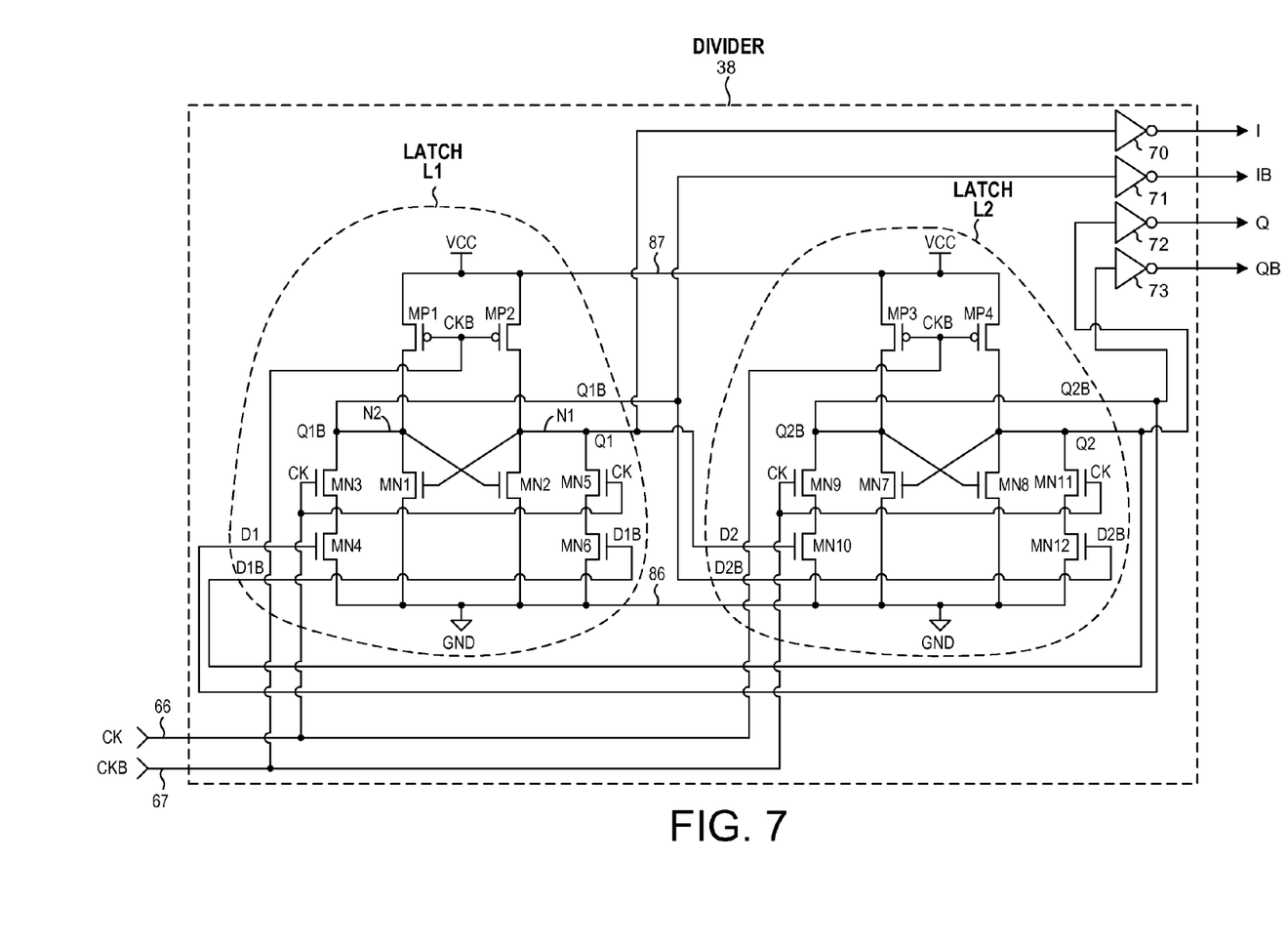
FIG. 7 is a circuit diagram of the divider 38 of FIG. 5.

FIG. 7 is a circuit diagram of divider 38 at the transistor level. Second latch L2 is of identical construction to first latch L1. Second latch L2 includes six N-channel transistors (MN7, MN8, MN9, MN10, MN11, MN12) and two P-channel transistors (MP3 and MP4).

Figure 8:
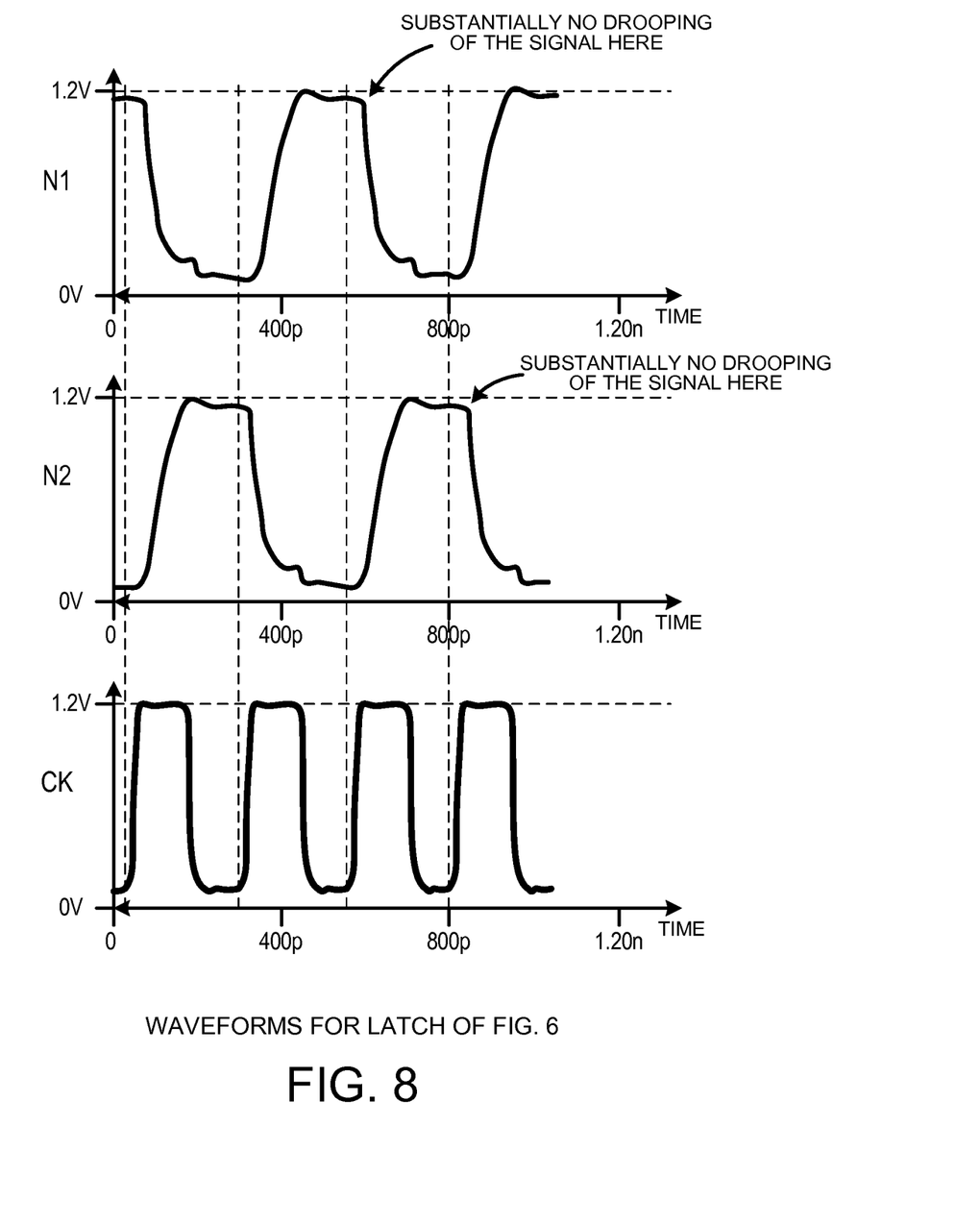
FIG. 8 is a waveform diagram that illustrates operation of the divider 38 of FIG. 7.

FIG. 8 is a waveform diagram that illustrates an operation of divider 38 of FIG. 7. The upper waveform is of the voltage on node N1. The middle waveform is of the voltage on node N2. The bottom waveform is of the incoming clock signal CK.

Figure 9:
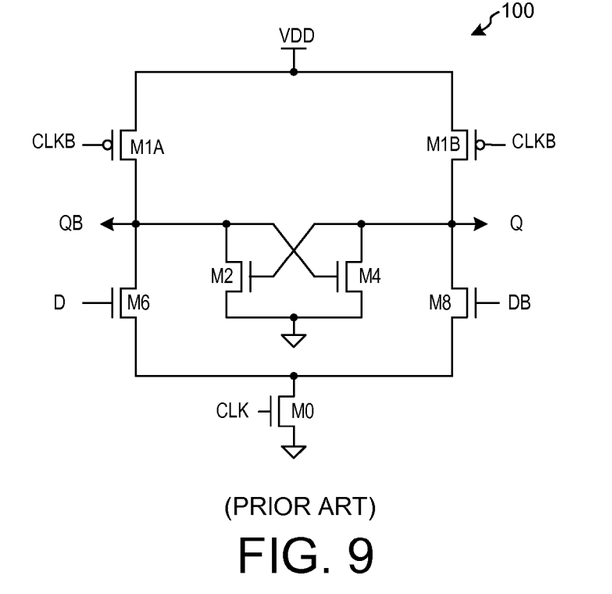
FIG. 9 (Prior Art) is a prior art latch.

FIG. 9 (Prior Art) is a diagram of a prior art latch circuit 100. An example of this circuit is set forth in FIG. 3D of U.S. Patent Publication US2009/0284288A1. The inventors have recognized that charge sharing occurs between nodes N1 and N2 of the circuit. The inventors now explain this charge sharing below in connection with the sequence of diagrams of FIG. 10, FIG. 11 and FIG. 12. These diagrams are not labeled as prior art because the recognition of the charge sharing is the inventor's achievement and is not disclosed in the US2009/0284288A1 document.

Figure 10:
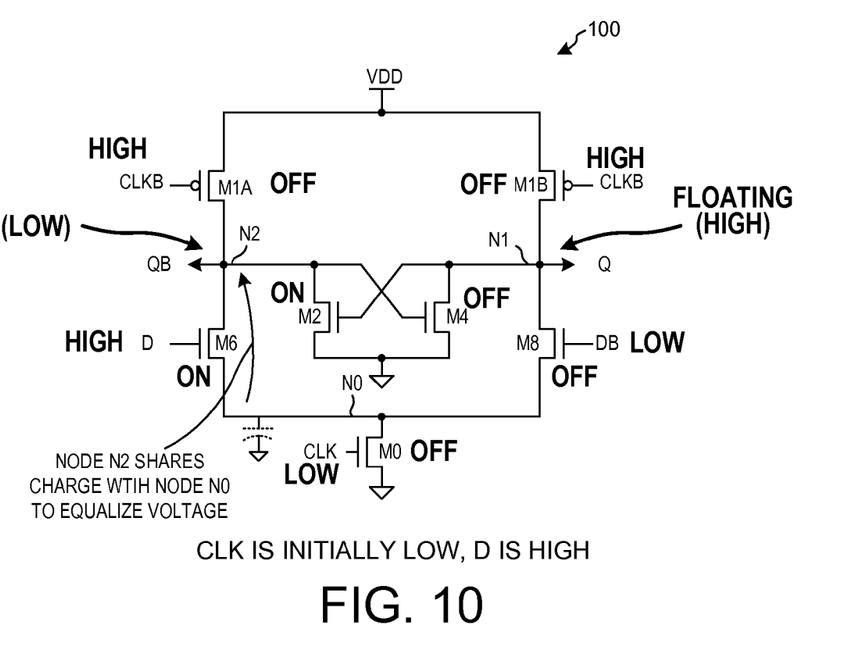
FIG. 10 is a diagram that illustrates operation of the latch of FIG. 9 in an initial condition.

FIG. 10 shows prior art latch 100 when the clock signal CK is low, and when the data input signal D is high. P-channel transistors M1A and M1B are off so the N1 and N2 nodes are not being coupled to the supply voltage VDD conductor by the latch. Also, the N-channel pull-down transistor M0 is off, so the N1 and N2 nodes are not being coupled to ground via transistors M6 and M8. The weak cross-coupled transistors M2 and M4 are latched so that M2 is on and M4 is off. In this condition, node N1 is said to be "floating" at a high voltage level. It is said to be floating because all of transistors M1B, M4, and M8 are off. In this circuit, however, transistor M6 is on due to the data signal D being high. Accordingly, the node N2 discharges the capacitance of the N0 node so that the voltage on the capacitance of node N0 will be discharged down to the low voltage of node N2.

Figure 11:
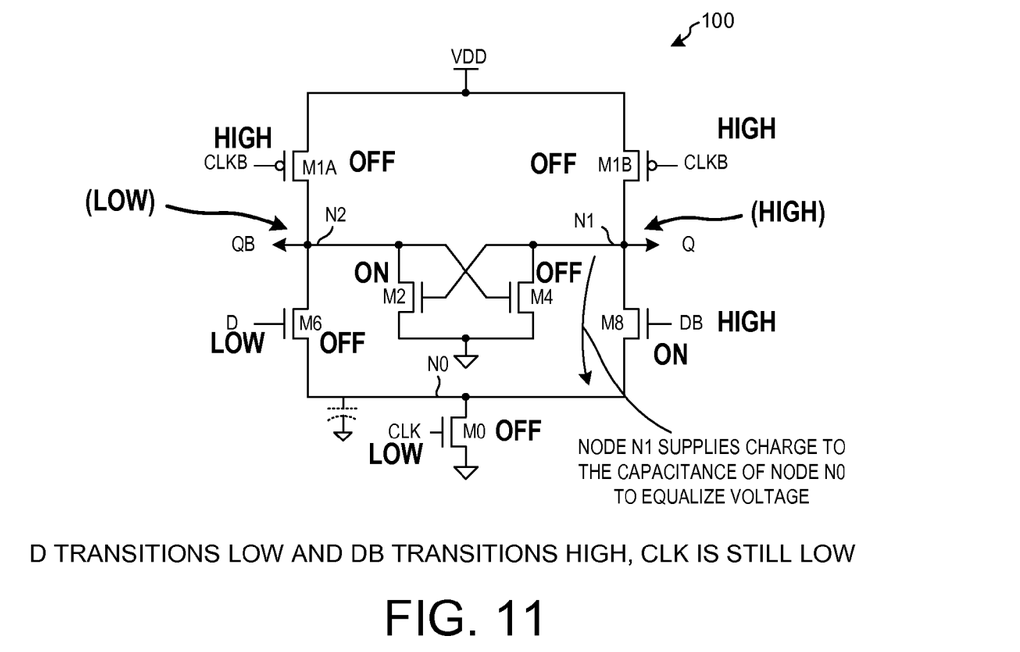
FIG. 11 is a diagram that illustrates operation of the latch of FIG. 9 at a time after the condition of FIG. 10.

FIG. 11 shows what happens next when the data input signal D transitions while the clock signal CK remains unchanged. Due to the transitioning of the data input signal D, however, transistor M6 is turned off and transistor M8 is turned on. Transistor M8 turning on allows charge sharing between node N0 and node N1. The voltage on node N1 momentarily drops a bit as the capacitance of node N0 is charged up to the higher voltage on node N1.

Figure 12:
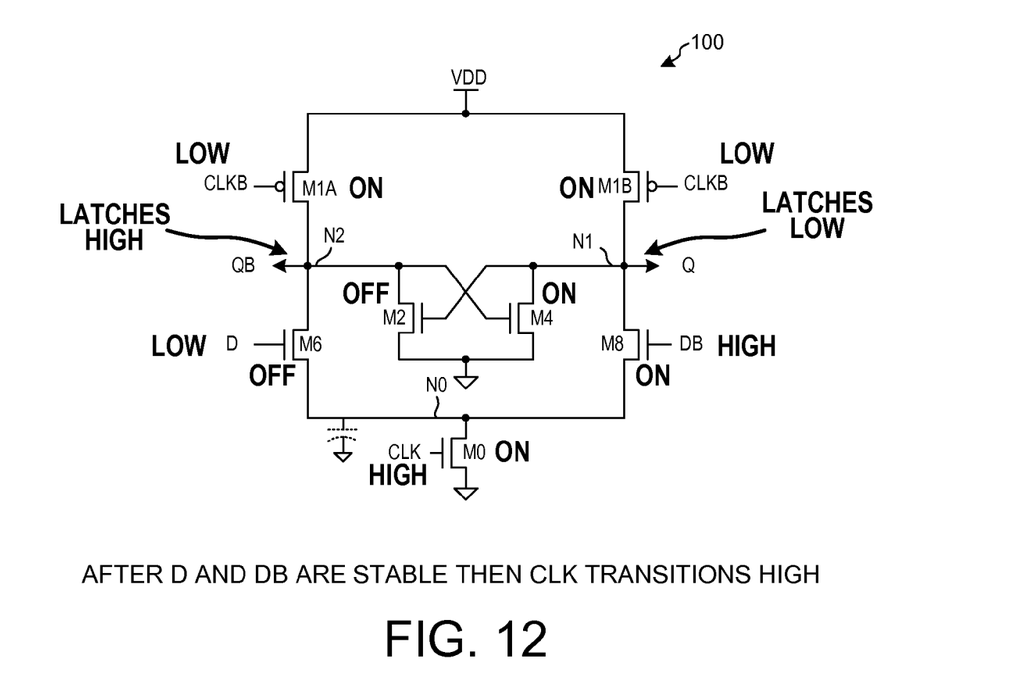
FIG. 12 is a diagram that illustrates operation of the latch of FIG. 9 at a time after the condition of FIG. 11.

FIG. 12 shows what happens next. Once the data input signal D is stable, then the clock signal CK transitions from low to high. Due to the logic level of the clock signal CK, the transistors M1A, M1B and M0 are all on. Neither of the nodes N1 and N2 is therefore said to be floating. The voltage on node N1 has latched low, and the voltage on node N2 has latched high. The prior art latch 100 of FIG. 9 goes through this sequence of FIG. 10, FIG. 11 and FIG. 12 when it switches in a divider application.

Figure 13:
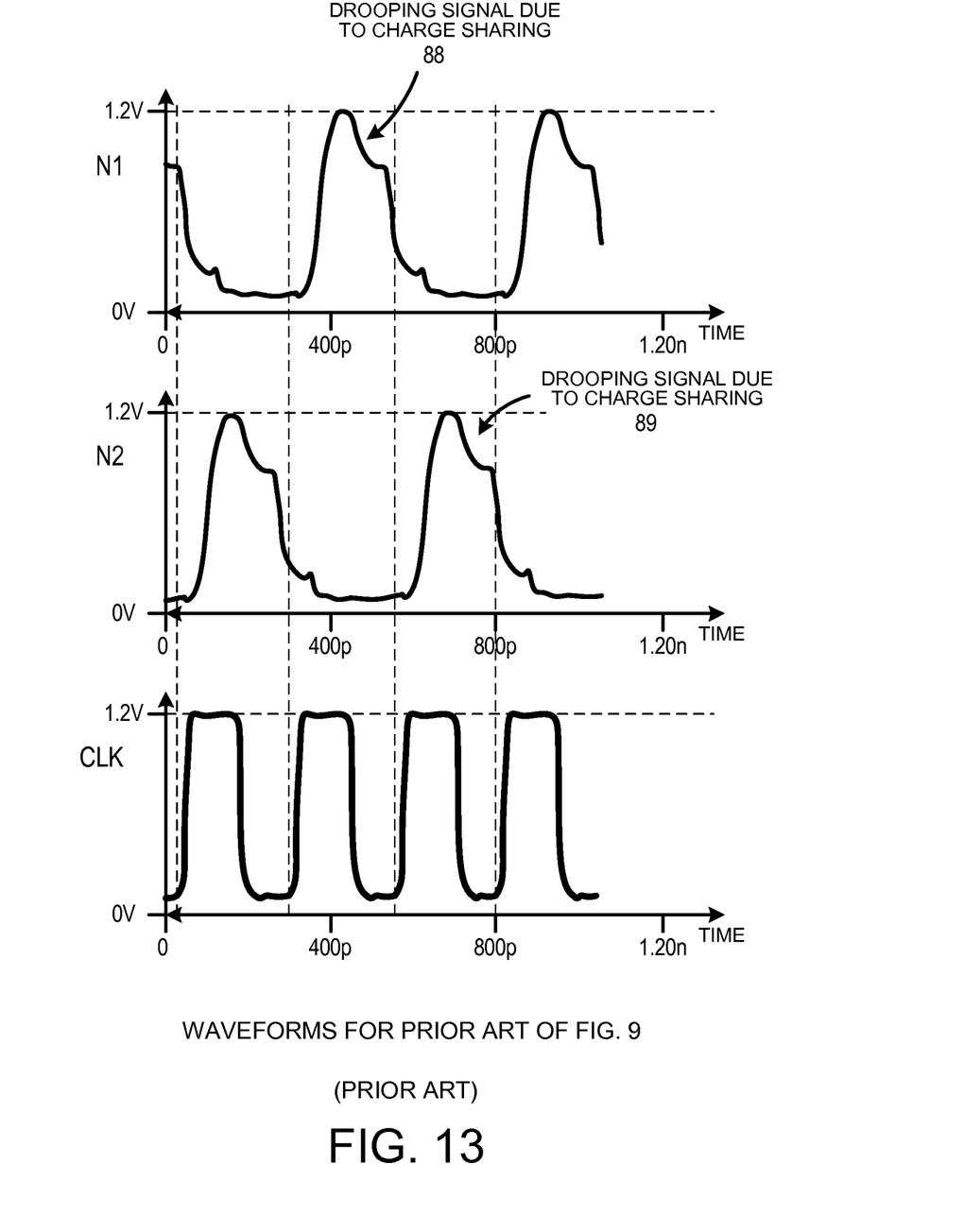
FIG. 13 is a waveform diagram that illustrates operation of a divider that uses the prior art latch of FIG. 9.

FIG. 13 (Prior Art) is a waveform diagram that illustrates operation of a divider that uses the prior art latch of FIG. 9. The upper waveform is of the voltage on node N1 of the latch. The middle waveform is of the voltage on node N2 of the latch. The bottom waveform is of the incoming clock signal CLK. Reference numeral 88 identifies a drooping of the signal on node N1 due the charge sharing illustrated in FIG. 10 and FIG. 11. The same drooping occurs on node N2. Reference numeral 89 identifies a drooping of the signal on node N2. In both cases, in response to a low-to-high transition of the clock signal CLK, the voltage on the node initially transitions high. But then after the clock signal CLK is stable, the data signal D transitions. This transitioning of the data signal D when the clock CK is low gives rise to the charge sharing that pulls the voltage on the floating node down as described above in connection with FIG. 10 and FIG. 11. Next, when the clock signal CLK is made to transition low-to-high, the changing of the state stored in the latch causes the voltage on the node to transition the rest of the way down to a low state. As can be seen from the N1 and N2 waveforms of FIG. 13, the upper right corners of the high pulses of the N1 and N2 waveforms exhibit a drooping signal characteristic. In a divider that uses such a prior art latch that exhibits such a distorted waveform, the switching point (trigger voltage) of the output inverters of the divider can be set lower (lower than the voltage where the drooping is seen) so that the drooping voltage level will tend not to cause premature switching of the output signals of the divider. Reducing the switching point of the output inverters in this way, however, is undesirable and increases jitter into the inverter output signal.

The N1 and N2 waveforms of FIG. 8 for the latch of FIG. 6 in the divider of FIG. 7, on the other hand, do not exhibit the undesirable drooping seen in FIG. 13. The N1 and N2 waveforms of FIG. 8 are closer to ideal rectangular waveforms than are the distorted N1 and N2 waveforms of FIG. 13. The reduced drooping improves phase noise in the divider output signals, and makes the positive duty cycle of the divider output signals more constant over frequency and over process. The switching point (trigger voltage) of the output inverters 70-73 of FIG. 7 is set at half of the supply voltage so extra jitter is not introduced into the divider output signals I, IB, Q and QB.

Figure 14:
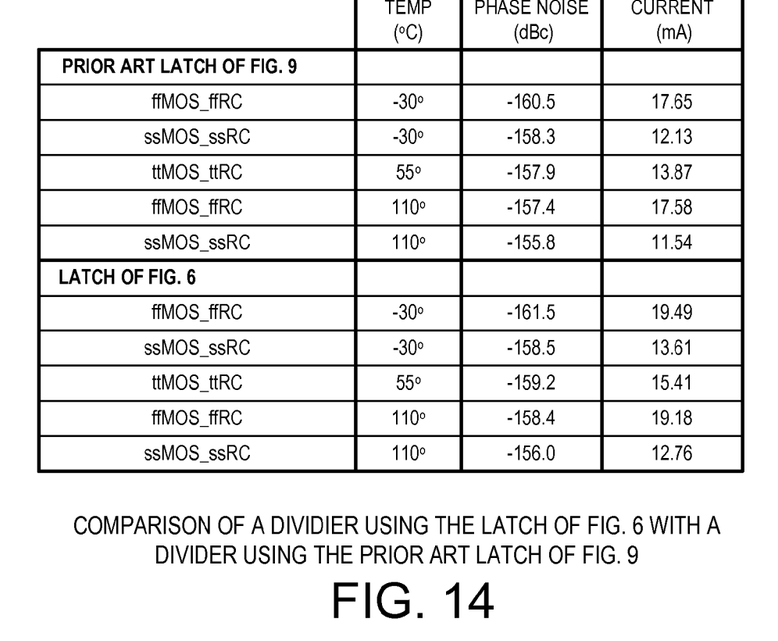
FIG. 14 is a table that compares characteristics of a divider using the latch of FIG. 6 to characteristics of a divider using the prior art latch of FIG. 9.

FIG. 14 is a table that sets forth phase noise and current consumption numbers for the divider 38 of FIG. 7 that uses the superior latch of FIG. 6 and for a divider that uses the inferior prior art latch of FIG. 9. The divider 38 that uses the latch of FIG. 6 exhibits improved phase noise as compared to the divider that the prior art of FIG. 9 for the same approximate current consumption and clocking frequency. For example, for a divider that is manufactured with a ttMOS_t-tRC process corner, and for this divider operating at 55 degrees Celsius, the divider that uses the prior art latch of FIG. 9 will output signals having a phase noise of approximately −157.9 dBc whereas the divider 38 of FIG. 7 that uses the latch of FIG. 6 will output signals with a reduced phase noise of approximately −159.2 dBc. The table of FIG. 14 shows that, as compared to phase noise of the signals output by a divider that uses the prior art latch of FIG. 9, the phase noise of the signals output by the divider 38 of FIG. 7 that uses the latch of FIG. 6 is less sensitive to manufacturing process variations.

Figure 15:
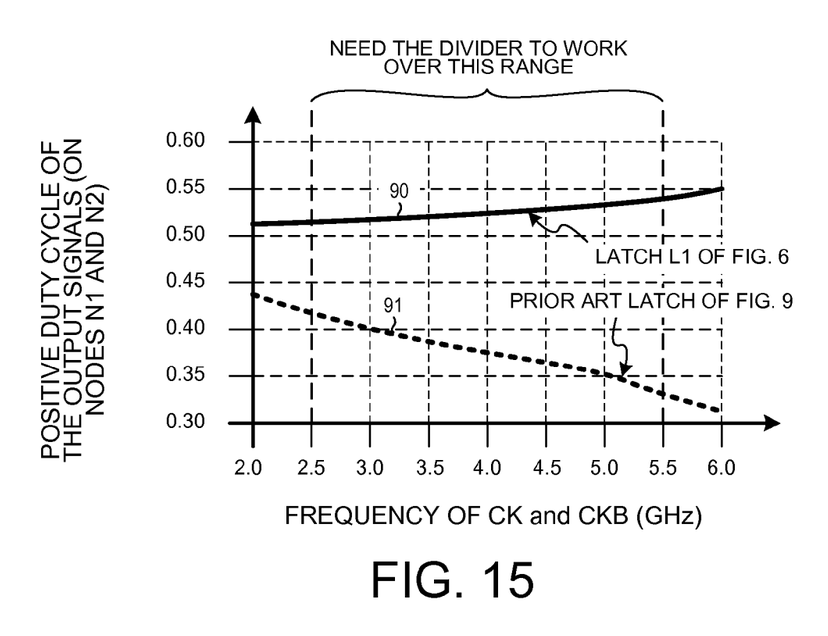
FIG. 15 is a chart that shows how the positive duty cycle of the output signals of the latch of FIG. 6 and of the prior art latch of FIG. 9 change as a function of input clock frequency.

FIG. 15 is a chart that illustrates another advantage of the latch of FIG. 6 over the prior art latch of FIG. 9. As indicated by line 90, the positive duty cycle of the output signals on nodes N1 and N2 of the latch of FIG. 6 have a relatively constant and stable value for input clock signal frequencies from 2.5 GHz to 5.5 GHz, whereas as indicated by line 91 the positive duty cycle of the corresponding signals output on nodes N1 and N2 of the prior art latch of FIG. 9 are relatively less constant and decrease substantially over the same 2.5

GHz to 5.5 GHz frequency range of the input clock signal. The divider 38 operates over the wider 2.5 GHz to 5.5 GHz range (even though the operating range is 3.0 GHz to 5.0 GHz) in order to provide margin and to increase manufacturing yield. The table of FIG. 14 shows that, as compared to the positive duty cycle of the output signals from the latch of FIG. 9, the positive duty cycle of the output signals from the divider 38 of FIG. 7 is less sensitive to variations in input clock signal frequency as compared to a divide that uses the prior art latch of FIG. 9.

Figure 16:
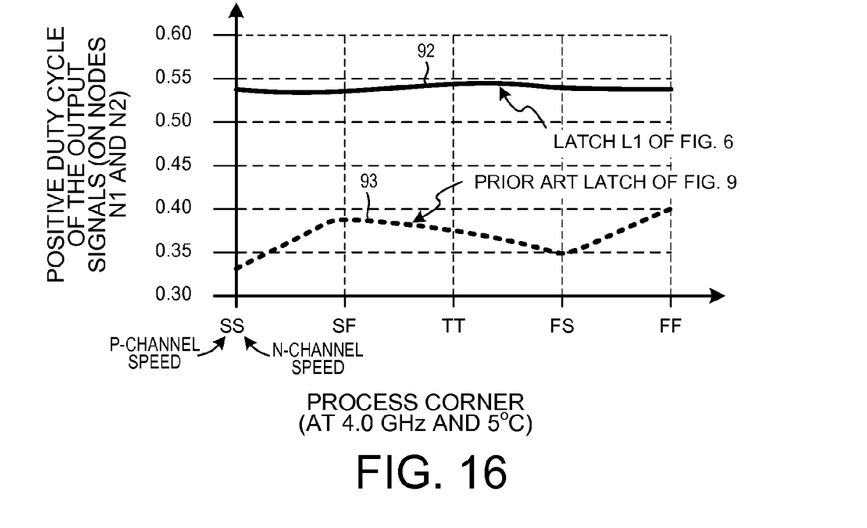
FIG. 16 is a diagram that shows how the positive duty cycle of the output signals of the latch of FIG. 6 and of the prior art latch of FIG. 9 change as a function of variations in manufacturing process.

FIG. 16 is a diagram that illustrates how the positive duty cycle of latch output signals varies with variations in the semiconductor manufacturing process used to make the latch. Line 92 shows how the positive duty cycle of the output signals of the latch L1 of FIG. 6 varies with variations in the manufacturing process. Line 93 shows how the positive duty cycle of the output signals of the prior art latch of FIG. 9 varies with variations in the manufacturing process. In the notation used along the horizontal axis of FIG. 16, the first letter in the manufacturing process notation indicates the speed of P-channel transistors, and the second letter in the manufacturing process notation indicates the speed of the N-channel transistors. "S" denotes slow, "T" denotes typical, and "F" denotes fast.

The pseudo-CML latch 68 of FIG. 6 is of general applicability in logic circuitry, and is not limited to use in high-speed dividers. The pseudo-CML latch can be realized in complementary form by changing all N-channel transistors to P-channel transistors, and by changing all P-channel transistors to N-channel transistors. The complementary form of the circuit has N-channel pull-down circuits that pull down on the latch output nodes, whereas the non-complementary form of the circuit shown in FIG. 6 has P-channel pull-up circuit that pull up on the latch output nodes.

Figure 17:
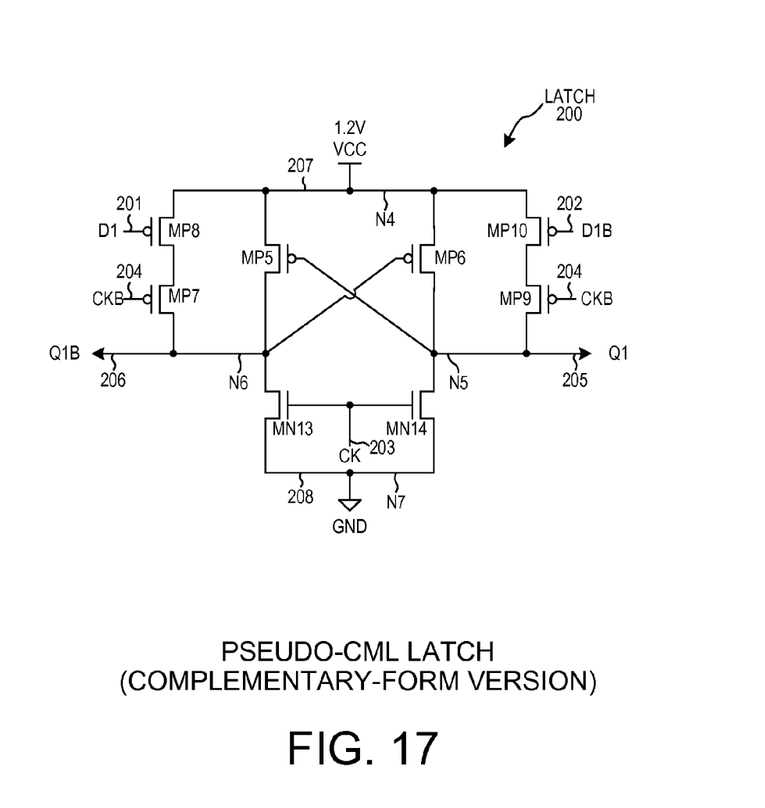
FIG. 17 is a diagram of a complementary-form pseudo-CML latch 200.

FIG. 17 is a diagram of a complementary-form pseudo-CML latch 200. Transistors MP5 and MP6 are a pair of weak signal-holding cross-coupled P-channel transistors, where the drain of the first transistor MP5 is coupled to a second latch output node N6, where the drain of the second transistors MP6 is coupled to a first latch output node N5, where the gate of the second transistor MP6 is coupled to the second latch output node N6, and where the gate of the first transistors MP5 is coupled to the first latch output node N5. Transistor MN13 is a first pull-down circuit coupled to pull down on the second latch output node N6. Transistors MN14 is a second pull-down circuit coupled to pull down on the first latch output node N5. Transistors MP7, MP8, MP9 and MP10 together are a pull-up circuit that: 1) couples the second latch output node N6 to a supply voltage node N4 (VCC) when a clock signal CK is high and a data signal D1 is low, 2) couples the first latch output node N5 to the supply voltage node N4 (VCC) when the clock signal CK is high and the data signal D1 is high, 3) prevents a transfer of charge between the first and second latch output nodes through the pull-down circuit when the data signal D1 transitions during a time period when the clock signal CK is low, and 4) decouples the circuit from the first and second latch output nodes when the clock signal CK is low. The latch 200 has a data signal input lead and conductor D1 201, an inverted data signal input lead and conductor D1B 202, a clock signal input lead and conductor CK 203, an inverted clock signal input lead and conductor CKB 204, a data signal output lead and conductor Q1 205, and an inverted data signal output lead and conductor Q1B 206. Reference numeral 207 identifies the supply voltage node N4 and conductor. Reference numeral 208 identifies the supply voltage node N7 and conductor. In a divider application, two identical instances of latch 200 are cascaded with the data outputs of the first latch being supplied to the data inputs of the second latch, and then the data outputs of the second latch are supplied back to the data inputs of the first latch in flipped fashion. The two latches are clocked on opposite phases of an incoming clock signal. Four inverters are provided to buffer and output the output signals of the two latches, thereby outputting the four latch output signals I, IB, Q and QB.

Figure 18:
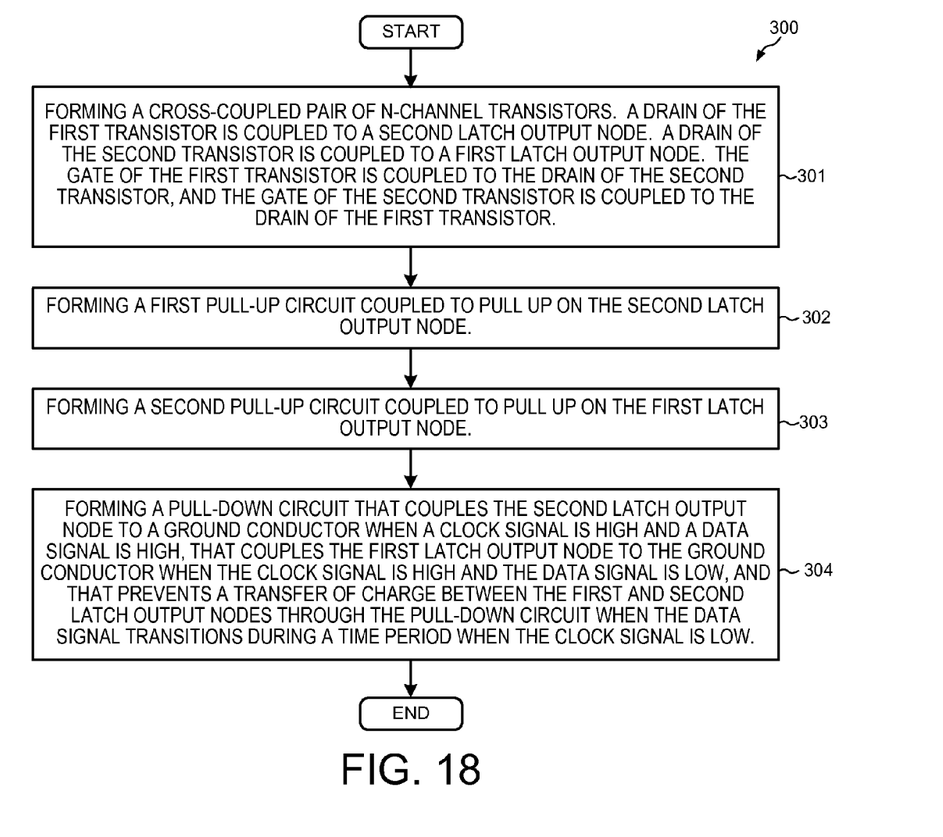
FIG. 18 is a flowchart of a method 300 in accordance with one novel aspect.

FIG. 18 is a flowchart of a method 300 in accordance with one novel aspect. Step 301 is a forming of a cross-coupled pair of N-channel transistors. A drain of the first N-channel transistor is coupled to a second latch output node. A drain of the second N-channel transistor is coupled to a first latch output node. The gate of the first transistor is coupled to the drain of the second transistor, and the gate of the second transistor is coupled to the drain of the first transistor. Step 302 is a forming of a first pull-up circuit coupled to pull up on the second latch output node. Step 303 is a forming of a second pull-up circuit coupled to pull up on the first latch output node. Step 304 is a forming of a pull-down circuit, where this pull-down circuit: 1) couples the second latch output node to a ground conductor when a clock signal is high and a data signal is high, 2) couples the first latch output node to the ground conductor when the clock signal is high and the data signal is low, 3) prevents a transfer of charge between the first and second latch output nodes through the pull-down circuit when the data signal transitions during a time period when the clock signal is low. The forming steps 301-304 can all be performed simultaneously in the use of a 65 nm CMOS semiconductor manufacturing process to make an integrated circuit form of the divider 38 of FIG. 7 on a semiconductor wafer.

Although certain specific embodiments are described above for instructional purposes, the teachings of this patent document have general applicability and are not limited to the specific embodiments described above. The pseudo-CML latch (68 or 200) has generally applicability in logic circuitry and is not limited to use in high-speed dividers. Accordingly, various modifications, adaptations, and combinations of the various features of the described specific embodiments can be practiced without departing from the scope of the claims that are set forth below.

What is claimed is:
1. A circuit comprising:
    a first N-channel transistor having a source, a drain, and a gate;
    a second N-channel transistor having a source coupled to the source of the first N-channel transistor, a drain coupled to the gate of the first N-channel transistor, and a gate coupled to the drain of the first N-channel transistor;
    a third N-channel transistor having a source, a gate, and a drain coupled to the drain of the first N-channel transistor;
    a fourth N-channel transistor having a source coupled to the source of the first N-channel transistor, a gate, and a drain coupled to the source of the third N-channel transistor;
    a fifth N-channel transistor having a source, a gate, and a drain coupled to the drain of the second N-channel transistor;
    a sixth N-channel transistor having a source coupled to the source of the second N-channel transistor, a gate, and a drain coupled to the source of the fifth N-channel transistor;

a first P-channel transistor having a source, a gate, and a drain coupled to the drain of the first N-channel transistor;
a second P-channel transistor having a source coupled to the source of the first P-channel transistor, a gate coupled to the gate of the first P-channel transistor, and a drain coupled to the drain of the second N-channel transistor;
a clock signal input conductor, wherein the gates of the third and fifth N-channel transistors are coupled to the clock signal input conductor; and
an inverted clock signal input conductor, wherein the gates of the first and second P-channel transistors are coupled to the inverted clock signal input conductor.

2. The circuit of claim 1, further comprising:
a ground conductor, wherein the sources of the first, second, fourth and sixth N-channel transistors are coupled to the ground conductor;
a supply voltage conductor, wherein the sources of the first and second P-channel transistors are coupled to the supply voltage conductor;
a data signal input conductor that is coupled to the gate of the fourth N-channel transistor;
an inverted data signal input conductor that is coupled to the gate of the sixth N-channel transistor;
a data signal output conductor, wherein the drain of the second N-channel transistor is coupled to the data signal output conductor; and
an inverted data signal output conductor, wherein the drain of the first N-channel transistor is coupled to the inverted data signal output conductor.

3. The circuit of claim 1, further comprising:
a seventh N-channel transistor having a source, a drain, and a gate;
an eighth N-channel transistor having a source coupled to the source of the seventh N-channel transistor, a drain coupled to the gate of the seventh N-channel transistor, and a gate coupled to the drain of the seventh N-channel transistor;
a ninth N-channel transistor having a source, a gate, and a drain coupled to the drain of the seventh N-channel transistor;
a tenth N-channel transistor having a source coupled to the source of the seventh N-channel transistor, a gate, and a drain coupled to the source of the ninth N-channel transistor;
an eleventh N-channel transistor having a source, a gate, and a drain coupled to the drain of the eighth N-channel transistor;
a twelfth N-channel transistor having a source coupled to the source of the eighth N-channel transistor, a gate, and a drain coupled to the source of the eleventh N-channel transistor;
a third P-channel transistor having a source, a gate, and a drain coupled to the drain of the seventh N-channel transistor; and
a fourth P-channel transistor having a source coupled to the source of the third P-channel transistor, a gate coupled to the gate of the third P-channel transistor, and a drain coupled to the drain of the eighth N-channel transistor,
wherein the drain of the second N-channel transistor is coupled to the gate of the tenth N-channel transistor,
wherein the drain of the first N-channel transistor is coupled to the gate of the twelfth N-channel transistor,
wherein the drain of the seventh N-channel transistor is coupled to the gate of the fourth N-channel transistor,
wherein the drain of the eighth N-channel transistor is coupled to the gate of the sixth N-channel transistor,
wherein the gates of the third and fifth N-channel transistors are coupled to the gates of the third and fourth P-channel transistors, and
wherein the gates of the ninth and eleventh N-channel transistors are coupled to the gates of the first and second P-channel transistors.

4. The circuit of claim 3, further comprising:
a first inverter coupled to receive a signal from the drain of the second N-channel transistor;
a second inverter coupled to receive a signal from the drain of the first N-channel transistor;
a third inverter coupled to receive a signal from the drain of the eighth N-channel transistor; and
a fourth inverter coupled to receive a signal from the drain of the seventh N-channel transistor.

5. The circuit of claim 1, wherein the first N-channel transistor is smaller than the third N-channel transistor, and wherein the second N-channel transistor is smaller than the fifth N-channel transistor.

6. A latch comprising:
a cross-coupled pair of transistors comprising a first N-channel transistor and a second N-channel transistor, wherein a drain the first N-channel transistor is coupled to a second latch output node, wherein a drain of the second N-channel transistor is coupled to a first latch output node, wherein a gate of the first N-channel transistor is coupled to the drain of the second N-channel transistor, and wherein a gate of the second N-channel transistor is coupled to the drain of the first N-channel transistor;
a first pull-up circuit coupled to the second latch output node;
a second pull-up circuit coupled to the first latch output node; and
means for coupling the second latch output node to a ground conductor when a clock signal is high and a data signal is high, and for coupling the first latch output node to the ground conductor when the clock signal is high and the data signal is low, and wherein the means is also for preventing a transfer of charge between the first and second latch output nodes through the means when the data signal transitions during a time period when the clock signal is low,
wherein the first pull-up circuit is a first. P-channel transistor having a source coupled to a supply voltage conductor, having a drain coupled to the second latch output node, and having a gate,
wherein the second pull-up circuit is a second P-channel transistor having a source coupled to the supply voltage conductor, having a drain coupled to the first latch output node, and having a gate coupled to the gate of the first P-channel transistor,
wherein the means receives the clock signal, and wherein an inverted clock signal is present on the gates of the first and second P-channel transistors.

7. The latch of claim 6, wherein the means comprises:
a first pair of transistors coupled in series between the second latch output node and the ground conductor, wherein one of the transistors of the first pair is controlled by the clock signal, wherein the other of the two transistors of the first pair is controlled by the data signal; and
a second pair of transistors coupled in series between the first latch output node and the ground conductor, wherein one of the transistors of the second pair is controlled by the clock signal, wherein the other of the two transistors of the second pair is controlled by an inverse of the data signal.

8. The latch of claim 6, wherein the means comprises:
a third N-channel transistor having a source, a drain, and a gate, wherein the drain is coupled to the second latch output node, and wherein the gate is coupled to receive the clock signal;
a fourth N-channel transistor having a source, a drain, and a gate, wherein the drain is coupled to the source of the third N-channel transistor, wherein the source is coupled to the ground conductor, and wherein the gate is coupled to receive the data signal;
a fifth N-channel transistor having a source, a drain, and a gate, wherein the drain is coupled to the first latch output node, and wherein the gate is coupled to receive the clock signal; and
a sixth N-channel transistor having a source, a drain, and a gate, wherein the drain is coupled to the source of the fifth N-channel transistor, wherein the source is coupled to the ground conductor, and wherein the gate is coupled to receive an inverse of the data signal.

9. A circuit comprising:
a first P-channel transistor having a source, a drain, and a gate;
a second P-channel transistor having a source coupled to the source of the first P-channel transistor, a drain coupled to the gate of the first P-channel transistor, and a gate coupled to the drain of the first P-channel transistor;
a third P-channel transistor having a source, a gate, and a drain coupled to the drain of the first P-channel transistor;
a fourth P-channel transistor having a source coupled to the source of the first P-channel transistor, a gate, and a drain coupled to the source of the third P-channel transistor;
a fifth P-channel transistor having a source, a gate, and a drain coupled to the drain of the second P-channel transistor;
a sixth P-channel transistor having a source coupled to the source of the second P-channel transistor, a gate, and a drain coupled to the source of the fifth P-channel transistor;
a first N-channel transistor having a source, a gate, and a drain coupled to the drain of the first P-channel transistor;
a second N-channel transistor having a source coupled to the source of the first N-channel transistor, a gate coupled to the gate of the first N-channel transistor, and a drain coupled to the drain of the second P-channel transistor;
an inverted clock signal input conductor, wherein the gates of the third and fifth P-channel transistors are coupled to the inverted clock signal input conductor; and
a clock signal input conductor, wherein the gates of the first and second N-channel transistors are coupled to the clock signal input conductor.

10. The circuit of claim 9, further comprising:
a supply voltage conductor, wherein the sources of the first, second, fourth and sixth P-channel transistors are coupled to the supply voltage conductor;
a ground conductor, wherein the sources of the first and second N-channel transistors are coupled to the ground conductor;
a data signal input conductor that is coupled to the gate of the fourth P-channel transistor;
an inverted data signal input conductor that is coupled to the gate of the sixth P-channel transistor;
a data signal output conductor, wherein the drain of the second P-channel transistor is coupled to the data signal output conductor; and
an inverted data signal output conductor, wherein the drain of the first P-channel transistor is coupled to the inverted data signal output conductor.

11. A circuit comprising:
a first N-channel transistor having a source, a drain, and a gate;
a second N-channel transistor having a source coupled to the source of the first N-channel transistor, a drain coupled to the gate of the first N-channel transistor, and a gate coupled to the drain of the first N-channel transistor;
a third N-channel transistor having a source, a gate, and a drain coupled to the drain of the first N-channel transistor;
a fourth N-channel transistor having a source coupled to the source of the first N-channel transistor, a gate, and a drain coupled to the source of the third N-channel transistor;
a fifth N-channel transistor having a source, a gate, and a drain coupled to the drain of the second N-channel transistor;
a sixth N-channel transistor having a source coupled to the source of the second N-channel transistor, a gate, and a drain coupled to the source of the fifth N-channel transistor;
a first P-channel transistor having a source, a gate, and a drain coupled to the drain of the first N-channel transistor; and
a second P-channel transistor having a source coupled to the source of the first P-channel transistor, a gate coupled to the gate of the first P-channel transistor, and a drain coupled to the drain of the second N-channel transistor;
a seventh N-channel transistor having a source, a drain, and a gate;
an eighth N-channel transistor having a source coupled to the source of the seventh N-channel transistor, a drain coupled to the gate of the seventh N-channel transistor, and a gate coupled to the drain of the seventh N-channel transistor;
a ninth N-channel transistor having a source, a gate, and a drain coupled to the drain of the seventh N-channel transistor;
a tenth N-channel transistor having a source coupled to the source of the seventh N-channel transistor, a gate, and a drain coupled to the source of the ninth N-channel transistor;
an eleventh N-channel transistor having a source, a gate, and a drain coupled to the drain of the eighth N-channel transistor;
a twelfth N-channel transistor having a source coupled to the source of the eighth N-channel transistor, a gate, and a drain coupled to the source of the eleventh N-channel transistor;
a third P-channel transistor having a source, a gate, and a drain coupled to the drain of the seventh N-channel transistor; and
a fourth P-channel transistor having a source coupled to the source of the third P-channel transistor, a gate coupled to the gate of the third P-channel transistor, and a drain coupled to the drain of the eighth N-channel transistor,
wherein the drain of the second N-channel transistor is coupled to the gate of the tenth N-channel transistor, wherein the drain of the first N-channel transistor is coupled to the gate of the twelfth N-channel transistor, wherein the drain of the seventh N-channel transistor is coupled to the gate of the fourth N-channel transistor, wherein the drain of the eighth N-channel transistor is coupled to the gate of the sixth N-channel transistor, wherein the gates of the third and fifth N-channel transistors are coupled to the gates of the third and fourth P-channel transistors, and wherein the gates of the ninth and eleventh N-channel transistors are coupled to the gates of the first and second P-channel transistors.

12. The circuit of claim 11, further comprising:

a first inverter coupled to receive a signal from the drain of the second N-channel transistor;

a second inverter coupled to receive a signal from the drain of the first N-channel transistor;

a third inverter coupled to receive a signal from the drain of the eighth N-channel transistor; and a fourth inverter coupled to receive a signal from the drain of the seventh N-channel transistor.

13. A circuit comprising:

a first P-channel transistor having a source, a drain, and a gate;

a second P-channel transistor having a source coupled to the source of the first P-channel transistor, a drain coupled to the gate of the first P-channel transistor, and a gate coupled to the drain of the first P-channel transistor;

a third P-channel transistor having a source, a gate, and a drain coupled to the drain of the first P-channel transistor;

a fourth P-channel transistor having a source coupled to the source of the first P-channel transistor, a gate, and a drain coupled to the source of the third P-channel transistor;

a fifth P-channel transistor having a source, a gate, and a drain coupled to the drain of the second P-channel transistor;

a sixth P-channel transistor having a source coupled to the source of the second P-channel transistor, a gate, and a drain coupled to the source of the fifth P-channel transistor;

a first N-channel transistor having a source, a gate, and a drain coupled to the drain of the first P-channel transistor;

a second N-channel transistor having a source coupled to the source of the first N-channel transistor, a gate coupled to the gate of the first N-channel transistor, and a drain coupled to the drain of the second P-channel transistor;

a seventh P-channel transistor having a source, a drain, and a gate;

an eighth P-channel transistor having a source coupled to the source of the seventh P-channel transistor, a drain coupled to the gate of the seventh P-channel transistor, and a gate coupled to the drain of the seventh P-channel transistor;

a ninth P-channel transistor having a source, a gate, and a drain coupled to the drain of the seventh P-channel transistor;

a tenth P-channel transistor having a source coupled to the source of the seventh P-channel transistor, a gate, and a drain coupled to the source of the ninth P-channel transistor;

an eleventh P-channel transistor having a source, a gate, and a drain coupled to the drain of the eighth P-channel transistor;

a twelfth P-channel transistor having a source coupled to the source of the eighth P-channel transistor, a gate, and a drain coupled to the source of the eleventh P-channel transistor;

a third N-channel transistor having a source, a gate, and a drain coupled to the drain of the seventh P-channel transistor; and a fourth N-channel transistor having a source coupled to the source of the third N-channel transistor, a gate coupled to the gate of the third N-channel transistor, and a drain coupled to the drain of the eighth P-channel transistor, wherein the drain of the second P-channel transistor is coupled to the gate of the tenth P-channel transistor, wherein the drain of the first P-channel transistor is coupled to the gate of the twelfth P-channel transistor, wherein the drain of the seventh P-channel transistor is coupled to the gate of the fourth P-channel transistor, wherein the drain of the eighth P-channel transistor is coupled to the gate of the sixth P-channel transistor, wherein the gates of the third and fifth P-channel transistors are coupled to the gates of the third and fourth N-channel transistors, and wherein the gates of the ninth and eleventh P-channel transistors are coupled to the gates of the first and second N-channel transistors.

* * * * *